United States Patent
Konno

(10) Patent No.: US 7,564,071 B2
(45) Date of Patent: Jul. 21, 2009

(54) SEMICONDUCTOR LIGHT EMITTING DEVICE

(75) Inventor: Taichiroo Konno, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 62 days.

(21) Appl. No.: 11/932,059

(22) Filed: Oct. 31, 2007

(65) Prior Publication Data
US 2008/0283819 A1 Nov. 20, 2008

(30) Foreign Application Priority Data
May 15, 2007 (JP) ............... 2007-129051

(51) Int. Cl.
*H01L 33/00* (2006.01)

(52) U.S. Cl. .......................... 257/98; 257/79
(58) Field of Classification Search ............ 257/79, 257/98
See application file for complete search history.

(56) References Cited

U.S. PATENT DOCUMENTS
6,779,987 B2 * 8/2004 Dexter et al. ............... 417/299

FOREIGN PATENT DOCUMENTS
JP 2002-217450 8/2002

* cited by examiner

*Primary Examiner*—Long Pham
(74) *Attorney, Agent, or Firm*—Scully, Scott, Murphy & Presser, P.C.

(57) ABSTRACT

A Si substrate 1, a metal adhesion layer 2, a reflective metal film 3 comprising a multilayer of metallic material having a light reflectivity, a $SiO_2$ film 4, an ohmic contact portion 5 provided at a predetermined position of the $SiO_2$ film 4, a GaP layer 6 including a Mg-doped GaP layer 6A and a Zn-doped GaP layer 6B, a p-type GaInP interposed layer 7, a p-type AlGaInP cladding layer 8, an undoped MQW active layer 9, an n-type AlGaInP cladding layer 10, an n-type AlGaInP window layer 11, an n-type GaAs contact layer 12, a first electrode 13, and a second electrode 14 are formed. The ohmic contact portion 5 is distant from the light emitting part including the p-type AlGaInP cladding layer 8, the undoped MQW active layer 9 and the n-type AlGaInP cladding layer 10 by not less than 300 nm.

16 Claims, 11 Drawing Sheets

FIG.1A

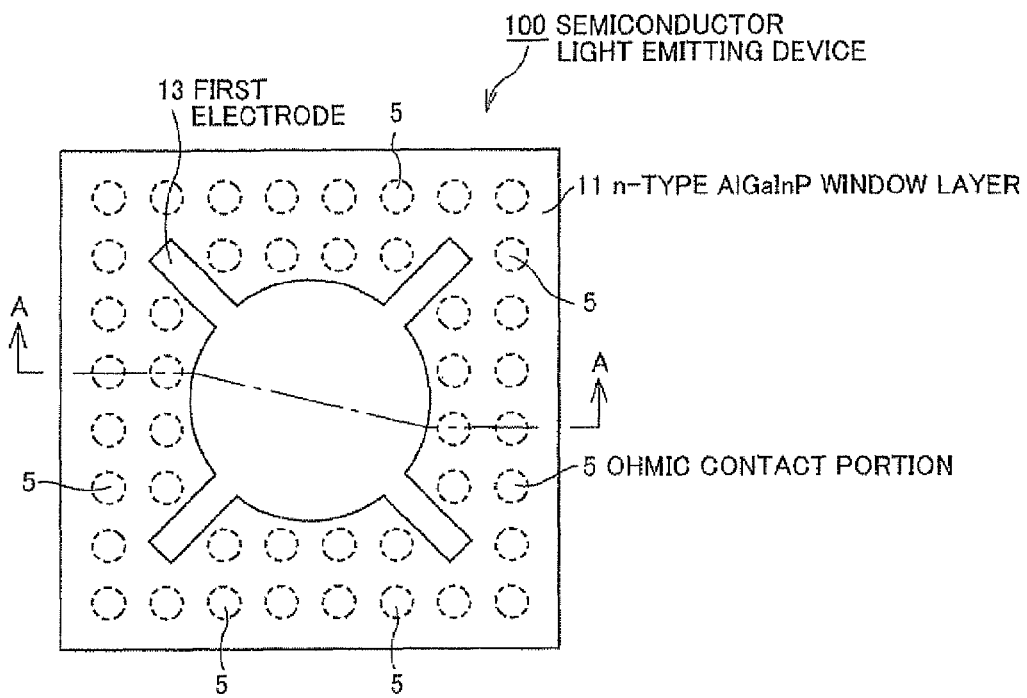

100 SEMICONDUCTOR LIGHT EMITTING DEVICE
13 FIRST ELECTRODE
11 n-TYPE AlGaInP WINDOW LAYER
5 OHMIC CONTACT PORTION

FIG.1B

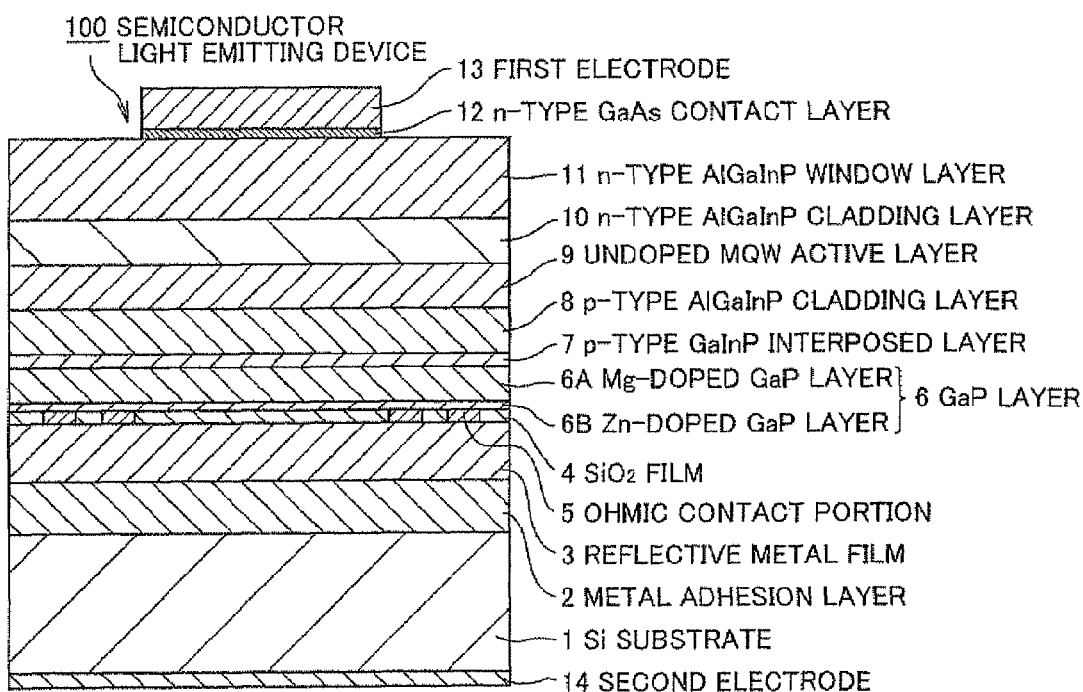

100 SEMICONDUCTOR LIGHT EMITTING DEVICE
13 FIRST ELECTRODE
12 n-TYPE GaAs CONTACT LAYER
11 n-TYPE AlGaInP WINDOW LAYER
10 n-TYPE AlGaInP CLADDING LAYER
9 UNDOPED MQW ACTIVE LAYER
8 p-TYPE AlGaInP CLADDING LAYER
7 p-TYPE GaInP INTERPOSED LAYER
6A Mg-DOPED GaP LAYER
6B Zn-DOPED GaP LAYER
6 GaP LAYER
4 SiO₂ FILM
5 OHMIC CONTACT PORTION
3 REFLECTIVE METAL FILM
2 METAL ADHESION LAYER
1 Si SUBSTRATE
14 SECOND ELECTRODE

30 LED EPITAXIAL WAFER

- 6B Zn-DOPED GaP LAYER ⎱ 6 GaP LAYER
- 6A Mg-DOPED GaP LAYER ⎰
- 7 p-TYPE GaInP INTERPOSED LAYER
- 8 p-TYPE AlGaInP CLADDING LAYER
- 9 UNDOPED MQW ACTIVE LAYER
- 10 n-TYPE AlGaInP CLADDING LAYER
- 11 n-TYPE AlGaInP WINDOW LAYER
- 12 n-TYPE GaAs CONTACT LAYER
- 21 UNDOPED AlGaInP ETCHING STOPPER LAYER
- 20 n-TYPE GaAs SUBSTRATE

4 SiO2 FILM

30 LED EPITAXIAL WAFER

- 12 n-TYPE GaAs CONTACT LAYER
- 11 n-TYPE AlGaInP WINDOW LAYER
- 10 n-TYPE AlGaInP CLADDING LAYER
- 9 UNDOPED MQW ACTIVE LAYER
- 8 p-TYPE AlGaInP CLADDING LAYER
- 7 p-TYPE GaInP INTERPOSED LAYER
- 6A Mg-DOPED GaP LAYER ⎫
- 6B Zn-DOPED GaP LAYER ⎭ 6 GaP LAYER
- 4 SiO2 FILM
- 5 OHMIC CONTACT PORTION
- 3 REFLECTIVE METAL FILM
- 2 METAL ADHESION LAYER
- 1 Si SUBSTRATE

13 FIRST ELECTRODE

FIG.7A

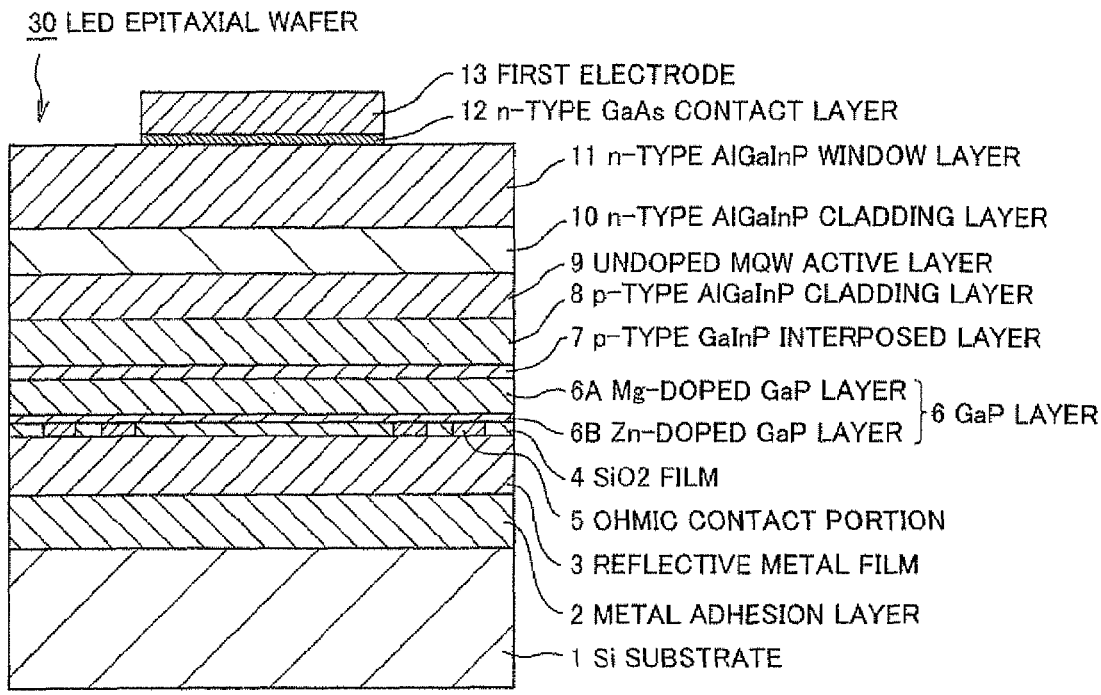

- 30 LED EPITAXIAL WAFER
- 13 FIRST ELECTRODE
- 12 n-TYPE GaAs CONTACT LAYER
- 11 n-TYPE AlGaInP WINDOW LAYER
- 10 n-TYPE AlGaInP CLADDING LAYER
- 9 UNDOPED MQW ACTIVE LAYER
- 8 p-TYPE AlGaInP CLADDING LAYER
- 7 p-TYPE GaInP INTERPOSED LAYER
- 6A Mg-DOPED GaP LAYER } 6 GaP LAYER
- 6B Zn-DOPED GaP LAYER
- 4 SiO2 FILM
- 5 OHMIC CONTACT PORTION
- 3 REFLECTIVE METAL FILM
- 2 METAL ADHESION LAYER
- 1 Si SUBSTRATE

FIG.7B

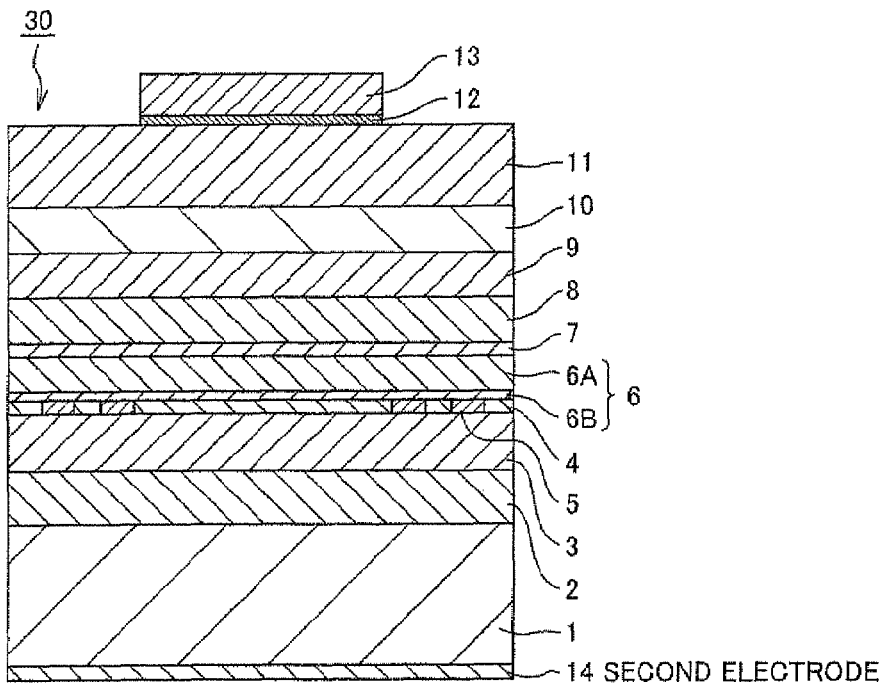

- 14 SECOND ELECTRODE

SEMICONDUCTOR LIGHT EMITTING DEVICE

The present application is based on Japanese Patent Application No. 2007-129051 filed on May 15, 2007, the entire contents of which are incorporated herein by reference.

BACKGROUND OF THE INVENTION

1. Field of the Invention

The present invention relates to a semiconductor light emitting device, in more particular, to a high luminance type semiconductor light emitting device.

2. Related Art

As to a light emitting diode (LED) which is a semiconductor light emitting device, it is possible to fabricate a high luminance LED emitting various color lights such as blue, green, orange, yellow, and red, since it is possible to grow a GaN based high quality crystal or an AlGaInP based high quality crystal by using MOVPE (Metal Organic Vapor Phase Epitaxy) method in recent years. In accordance with the provision of a high luminance LED, applications of the LED are widened, e.g. a back light of a liquid crystal display, a brake lump for a vehicle so that demand for the LED increases year by year.

Since the growth of a high quality crystal by using the MOVPE method has been achieved, a light emitting efficiency inside the light emitting device is nearing to a theoretical limit value. However, the light extract efficiency from the light emitting device to the outside is still low, and enhancement of the light extract efficiency is important.

For example, a high luminance red LED is made from AlGaInP based materials, and has a double hetero structure comprising a conductive GaAs substrate, an n-type AlGaInP layer comprising an AlGaInP based material with a composition which is lattice-matched with the conductive GaAs substrate, a p-type AlGaInP layer, and an active layer which is a part of a light emitting part comprising AlGaInP or GaInP, in which the active layer is sandwiched by the n-type AlGaInP layer and the p-type AlGaInP layer.

Since a bandgap of the GaAs substrate is narrower than that of the active layer in such a semiconductor light emitting device, most of the light emitted from the active layer is absorbed by the GaAs substrate, so that the light extract efficiency is significantly deteriorated.

As means for solving this problem, there is a technique for improving the light extract efficiency by forming a layer with a multilayer reflective film structure comprising semiconductor layers having different refractive indices between the active layer and the GaAs substrate, to reflect the light emitted to the GaAs substrate, thereby reducing absorption of the light in the GaAs substrate. However, according to this technique, only the light having a limited incident angle with respect to the multilayer reflective film structure layer is reflected.

Thus, Japanese Patent Laid-Open No. 2002-217450 discloses another technique for realizing a high luminance by forming a semiconductor light emitting device in which a double hetero structure part comprising AlGaInP based material is grown on a GaAs substrate for growth, sticking the double hetero structure part on a Si supporting substrate via a metal layer with a high reflectance, and removing the GaAs substrate used for the growth. According to this technique, since the metal film is used as a reflective film, the reflection with high reflectance can be realized without selecting an incident angle with respect to the reflective film.

In addition, the reflective film comprising a metal having a high reflectance such Au, Al, and Ag cannot be joined by ohmic-contact with an AlGaInP based semiconductor. Accordingly, it is necessary to provide an ohmic contact portion comprising a material different from a metal composing the reflective film at an interface between an AlGaInP based compound semiconductor layer and the reflective metal film, to reduce an electrical resistivity.

In general, the ohmic contact portion comprises a Zn based metal, since a contacting surface is a p-type semiconductor layer.

However, in case of using the Zn based material, a forward voltage cannot be reduced enough. This tendency is remarkable, when an area of an ohmic contact portion in the LED bare chip is small.

As a technique for reducing the forward voltage, there is a technique of elevating a heat treatment temperature. However, according to this technique, an alloying reaction occurs between the semiconductor layer and the ohmic contact portion, so that a light absorption rate of the semiconductor layer contacting with the ohmic contact portion is increased. In addition, the light absorption in a reflective metal film other than the ohmic contact portion is increased, since a reaction between the reflective metal film and other metals is promoted. In other words, there is a disadvantage in that deterioration of a light output is involved when the heat treatment temperature is elevated to reduce the forward voltage.

Accordingly, it is necessary to use a material for the ohmic contact portion by which the contact is easily provided compared with the Zn based material. A Be based material is one of such materials.

However, according to conventional semiconductor light emitting device using the Be based material for the ohmic contact portion, there is a disadvantage in that the light output is low and a reliability of the device is low, although the forward voltage can be reduced compared with the semiconductor light emitting device using the Zn based material for the ohmic contact portion.

In other words, it is difficult to reduce the forward voltage while keeping the light output. This tendency is remarkable, when the area of the ohmic contact portion in the LED bare chip is small. This problem is a big issue for providing a higher output of the semiconductor light emitting device in future.

SUMMARY OF THE INVENTION

Accordingly, so as to solve the above problem, it is an object of the present invention to provide a semiconductor light emitting device, in which the forward voltage can be reduced while keeping the light output and which is excellent in the reliability.

According to a feature of the present invention, a semiconductor light emitting device comprises:

an epitaxial layer including a light emitting part;

an ohmic contact portion contacting with the epitaxial layer;

a reflective metal film for reflecting a light emitted from the light emitting part, and contacting with the ohmic contact portion, and being opaque with respect to the light emitted from the light emitting part;

a supporting substrate, one surface of the supporting substrate bonded to the reflective metal film via a metal adhesion layer;

a first electrode provided at one surface of the epitaxial layer; and a second electrode at another surface of the supporting substrate;

wherein the ohmic contact portion comprises Be and is distant from the light emitting part by not less than 300 nm.

In the semiconductor light emitting device, the epitaxial layer may comprise a GaP layer as a second conductivity type semiconductor layer, and the GaP layer is contacting with the ohmic contact portion.

In the semiconductor light emitting device, the light emitting part may comprise an active layer, a first conductivity type semiconductor layer comprising a material selected from a group consisting of Se, Si and Te, and a second conductivity type semiconductor layer comprising a dopant selected from a group consisting of Mg and Zn.

In the semiconductor light emitting device, the second conductivity type semiconductor layer may comprise a first layer doped with Mg and a second layer doped with Zn sequentially deposited.

The semiconductor light emitting device may further comprise:

a third layer provided between the first layer and the second layer, wherein the third layer is not positively doped with dopant, and the second layer is contacting with the ohmic contact portion.

In the semiconductor light emitting device, it is preferable that a thickness of the third layer is from 5 nm to 200 nm.

The semiconductor light emitting device may further comprise:

a layer having a bandgap energy smaller than that of an active layer constituting the light emitting part between the first electrode and the epitaxial layer.

In the semiconductor light emitting device, it is preferable that a thickness of the layer having the bandgap energy smaller than that of the active layer is from 5 to 200 nm.

The semiconductor light emitting device may further comprise:

an interposed layer comprising $Ga_XIn_{1-X}P$ ($0.6 \leq X$) between the ohmic contact portion and the second conductivity type semiconductor layer constituting the light emitting part.

The semiconductor light emitting device may further comprise:

an undoped layer between the active layer and the first conductivity type semiconductor layer or the second conductivity type semiconductor layer, or between the active layer, the first conductivity type semiconductor layer and the second conductivity type semiconductor layer.

In the semiconductor light emitting device, the active layer may comprise a multiquantum well structure including 10 to 80 pairs of well layers.

In the semiconductor light emitting device, the epitaxial layer may comprise a plurality of layers provided above the light emitting part and being transparent with respect to the light emitted from the light emitting part.

In the semiconductor light emitting device, the ohmic contact portion may be buried in an oxide layer provided between the second conductivity type semiconductor layer and the reflective metal film, and a thickness of the oxide layer is within a range of ±30% of a thickness d determined based on a wavelength of the light emitted from the light emitting part and a refractive index of the oxide layer.

In the semiconductor light emitting device, the supporting substrate may comprise a material selected from a group consisting of Si, GaAs, and Ge.

In the semiconductor light emitting device, the supporting substrate may comprise a metal selected from a group consisting of Cu, Mo, W, and Ge, or an alloy of CuW.

In the semiconductor light emitting device, the ohmic contact portion may further comprise a transition metal According to the present invention, it is possible to provide a semiconductor light emitting device, in which the forward voltage can be reduced while keeping the light output and which is excellent in the reliability.

BRIEF DESCRIPTION OF THE DRAWINGS

The present invention will be explained in more detail in conjunction with appended drawings, wherein:

FIGS. 1A and 1B are schematic diagrams showing a semiconductor light emitting device in a preferred embodiment according to the present invention, in which FIG. 1A is a plan view of the semiconductor light emitting device, and FIG. 1B is a cross sectional view of the semiconductor light emitting device along A-A;

FIGS. 2A to 7B are explanatory diagrams showing a process of a method for fabricating the semiconductor light emitting device in the preferred embodiment according to the present invention;

DETAILED DESCRIPTION OF THE PREFERRED EMBODIMENT

Figure 2A:
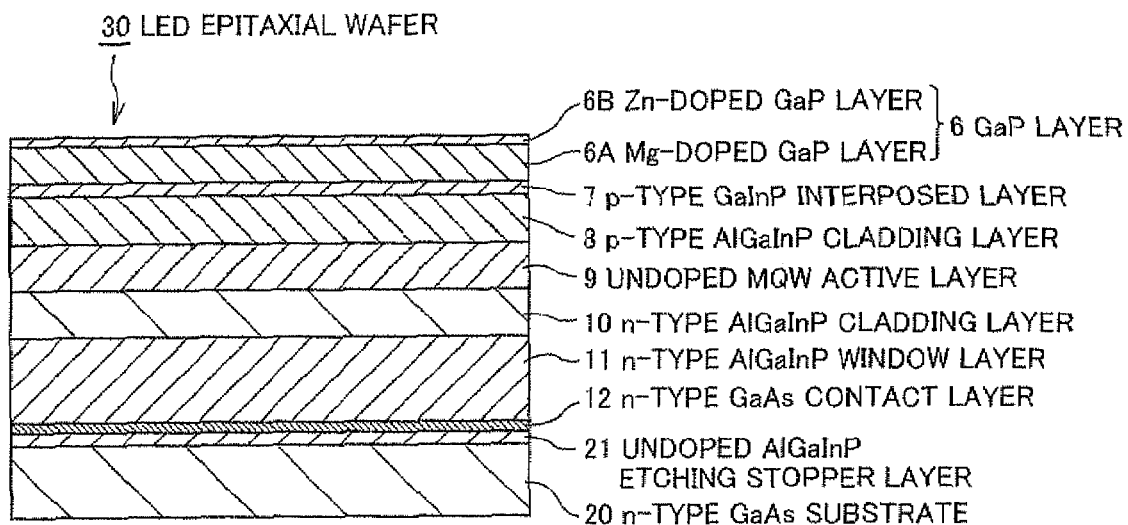

Next, the preferred embodiment according to the present invention will be explained in more detail in conjunction with the appended drawings.

(Structure of a Semiconductor Light Emitting Device)

FIGS. 1A and 1B are schematic diagrams showing a semiconductor light emitting device in a preferred embodiment according to the present invention, in which FIG. 1A is a plan view of the semiconductor light emitting device, and FIG. 1B is a cross sectional view of the semiconductor light emitting device along A-A.

A semiconductor light emitting device 100 is for example a red LED having an emission wavelength of about 630 nm.

As shown in FIG. 1B, a semiconductor light emitting device 100 in the preferred embodiment according to the invention comprises a Si substrate 1, a metal adhesion layer 2 comprising a multilayer of metallic material, a reflective metal film 3 comprising a multilayer of metallic material having a light reflectivity, a $SiO_2$ film 4, an ohmic contact portion 5 provided at a predetermined position of the $SiO_2$ film 4, a GaP layer 6 including a Mg-doped GaP layer 6A and a Zn-doped GaP layer 6B, a p-type GaInP interposed layer 7, a p-type AlGaInP cladding layer 8, an undoped multiquantum well (MQW) active layer 9, an n-type AlGaInP cladding layer 10, an n-type AlGaInP window layer 11, an n-type GaAs contact layer 12, a first electrode 13, and a second electrode 14 provided at an outer connection side of the Si substrate 1, in which the p-type AlGaInP cladding layer 8, the undoped MQW active layer 9 and the n-type AlGaInP cladding layer 10 constitute a light emitting part.

As the metal adhesion layer 2, gold/germanium (AuGe) alloy, titanium (Ti), and gold (Au) are deposited in this order to have a film thickness of 100 nm, 200 nm, and 500 nm, respectively (total thickness is 800 nm), on an entire surface of a bottom surface of the Si substrate 1.

As the reflective metal film 3, aluminum (Al), titanium (Ti), and gold (Au) are deposited in this order to have a film thickness of 200 nm, 200 nm, and 500 nm, respectively (total thickness is 900 nm).

The $SiO_2$ film 4 is formed to have a thickness of 100 nm.

The ohmic contact portion 5 is formed as follows. Etching process or patterning process is conducted by photolithography to form holes penetrating the $SiO_2$ film 4 each having a diameter of about 12 μm, and a conductive material is provided in the hole by vacuum deposition method. In order to form an alloy from the conductive material, an alloying process is conducted by heating the conductive material in an atmosphere of nitrogen gas at a temperature of 350° C. for 5 minutes. The ohmic contact portion 5 is a dot-shaped electrode with a diameter of about 10 μm and a thickness of 100 nm, and provided in vicinity of a branch portion in a region except a region just beneath the first electrode 13 with a pitch of 30 μm. As the conductive material for forming the ohmic contact portion 5, for example, a gold-zinc (AuZn) alloy may be used.

The GaP layer 6 comprises an Mg-doped p-type GaP layer 6A with a carrier concentration $1 \times 10^{18}/cm^3$ and a thickness of 200 nm as a first layer, and a Zn-doped p-type GaP layer 6B with a carrier concentration of $1 \times 10^{19}/cm^3$ and a thickness of 50 nm as a second layer.

The p-type GaInP interposed layer 7 is composed of Mg-doped p-type $Ga_xIn_{1-x}P$ ($0.6 \leq x$).

The p-type AlGaInP cladding layer 8 is composed of Mg-doped p-type $(Al_{0.7}Ga_{0.3})_{0.5}In_{0.5}P$ with a carrier concentration of $1.2 \times 10^{18}/cm^3$ and a thickness of 400 nm.

The undoped MQW active layer 9 is composed of 20 pairs of GaInP layer and AlGaInP layer, in which a GaInP layer and an AlGaInP layer constitute one pair.

The n-type AlGaInP cladding layer 10 is composed of Se-doped n-type $(Al_{0.7}Ga_{0.3})_{0.5}In_{0.5}P$ with a carrier concentration of $5 \times 10^{17}/cm^3$ and a thickness of 500 nm.

The n-type AlGaInP window layer 11 is composed of Se-dope n-type $(Al_{0.4}Ga_{0.6})_{0.5}In_{0.5}P$ with a carrier concentration $1 \times 10^{18}/cm^3$ and a thickness of 3000 nm.

The n-type GaAs contact layer 12 is composed of Se-doped n-type GaAs with a carrier concentration $1 \times 10^{18}/cm^3$ and a thickness of 50 nm.

The first electrode 13 comprises a circular portion with a diameter of 100 μm and distributed electrodes extending radially in a cross shape with a width of 10 μm from the circular portion, and the first electrode 13 is formed by patterning and etching using the photolithography on the n-type GaAs contact layer 12. As the first electrode 13, gold/germanium (AuGe) alloy, nickel (Ni), and gold (Au) are deposited in this order to have a film thickness of 100 nm, 100 nm, and 500 nm, respectively (total thickness is 700 nm).

The first electrode 14 is formed by the vacuum deposition on an entire surface of a surface opposite to the surface of the Si substrate 1 on which the metal adhesion layer 2 is formed. Al, Ti, and Au are deposited in this order as the conductive materials. In order to form an alloy from the conductive materials, an alloying process is conducted by heating the conductive materials in an atmosphere of nitrogen gas at a temperature of 400° C. for 5 minutes.

(Method for Fabricating the Semiconductor Light Emitting Device)

FIGS. 2A to 7B are explanatory diagrams showing a process of a method for fabricating the semiconductor light emitting device in the preferred embodiment according to the present invention. The method for fabricating the semiconductor light emitting device will be explained in conjunction with the appended drawing.

At first, as shown in FIG. 2A, on an n-type GaAs substrate (substrate for growth) 20, an undoped $(Al_{0.7}Ga_{0.3})_{0.5}In_{0.5}P$ etching stopper layer 21 (a film thickness of 200 nm and a carrier concentration of $1 \times 10^{18}/cm^3$), an n-type GaAs contact layer 12, an n-type AlGaInP window layer 11, an n-type AlGaInP cladding layer 10, undoped MQW active layer 9, a p-type AlGaInP cladding layer 8, a p-type GaInP interposed layer 7, a p-type GaP layer 6A, and a p-type GaP layer 6B are sequentially grown by the MOVPE method to provide an LED epitaxial wafer 30.

The growth condition of the MOVPE method is as follows. A growth temperature is 650° C., a growth pressure is 50 Torr, a growth rate of each layer is from 0.3 nm/sec to 2.0 nm/sec, and a V/III ratio is about 100. The V/III ratio is a proportion (quotient) in that a mol number of III group material such as TMGa, TMAl is a denominator, and a mol number of V group material such as $AsH_3$, $PH_3$ is a numerator.

As a source for the MOVPE method, an organic metal such as trimethylgallium (TMGa), triethylgallium (TEGa), trimethylaluminum (TMAl), trimethylindium (TMIn), or the like, and a hydride gas such as arsine ($AsH_3$), phosphine ($PH_3$) or the like are used.

As a dopant source for a conductivity type determination impurity (dopant) of the n-type semiconductor layer, hydrogen selenide ($H_2Se$) is used. As the dopant source for a conductivity type determination dopant of the p-type semiconductor layer, bis(cyclopentadienyl)magnesium ($Cp_2Mg$), or dimethylzinc (DMZn) is used.

In addition, as the dopant source for the conductivity type determination dopant of the n-type semiconductor layer, disilane ($Si_2H_6$), monosilane ($SiH_4$), diethyl tellurium (DETe), or dimethyl tellurium (DMTe) may be used. As the dopant source for the conductivity type determination dopant of the p-type semiconductor layer, diethyl zinc (DEZn) may be used.

Figure 2B:
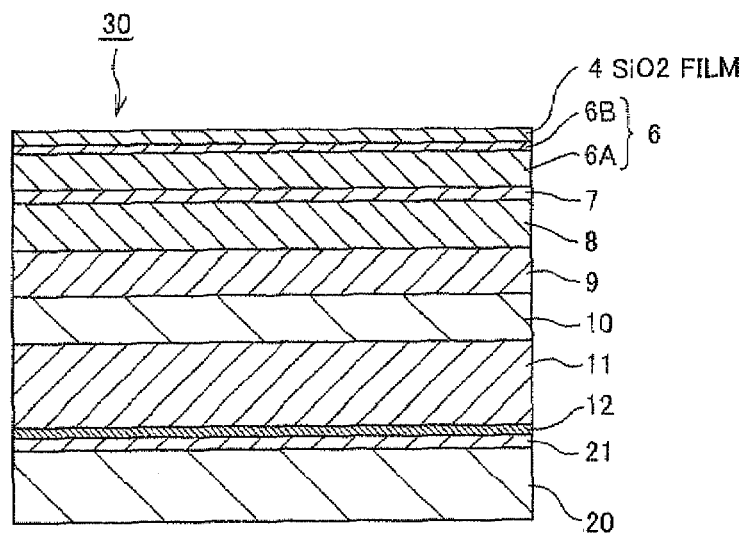

Next, as shown in FIG. 2B, a $SiO_2$ film 4 is grown by using a plasma CVD apparatus to have a thickness of 100 nm on the p-type GaP layer 6B composing the p-type GaP layer 6 of the LED epitaxial wafer 30. A thickness of the $SiO_2$ film 4 is within a range of ±30% of a film thickness d that is expressed as $$d = A \times \lambda/4 \times n$$

(d is the film thickness, A is a constant of an odd number, λ is a wavelength of the light emitted from the light emitting part, and n is a refractive index of $SiO_2$).

Figure 3A:
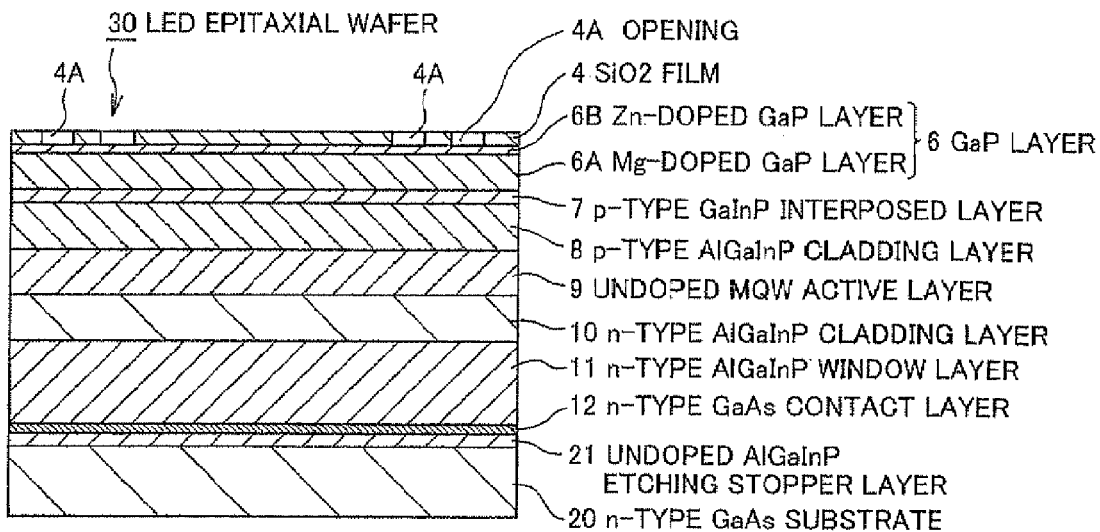

As shown in FIG. 3A, a plurality of holes 4A each having a diameter of about 12 μm are formed at the $SiO_2$ film 4 by using the photolithography such as resist, mask aligner and a hydrofluoric acid based etching liquid.

Figure 3B:
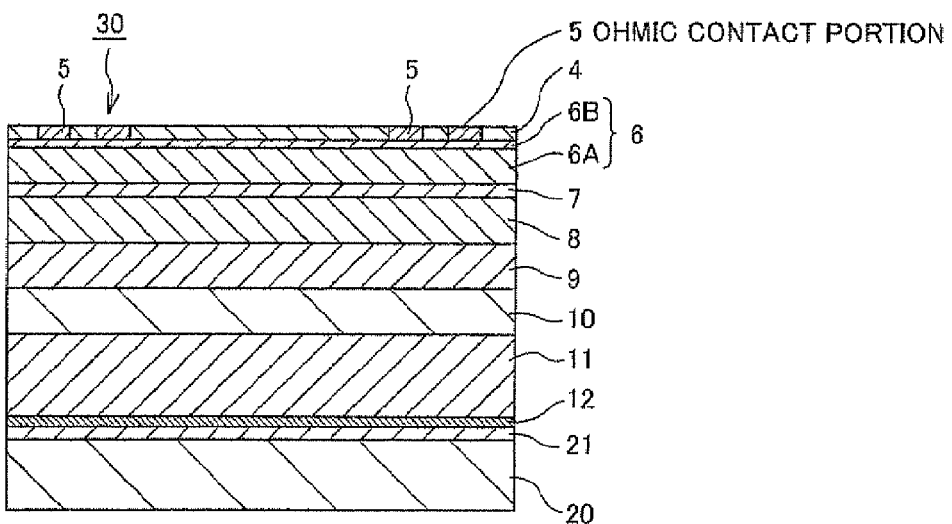

Next, as shown in FIG. 3B, the ohmic contact portion 5 is formed in the hole 4A by vacuum deposition method. A plurality of the ohmic contact portions 5 are not provided just beneath a pad portion and branch portions (cross-shaped portion) of the first electrode 13 provided at a later process, but provided to surround an outer side of the first electrode 13 as shown in FIG. 1A.

Figure 4A:
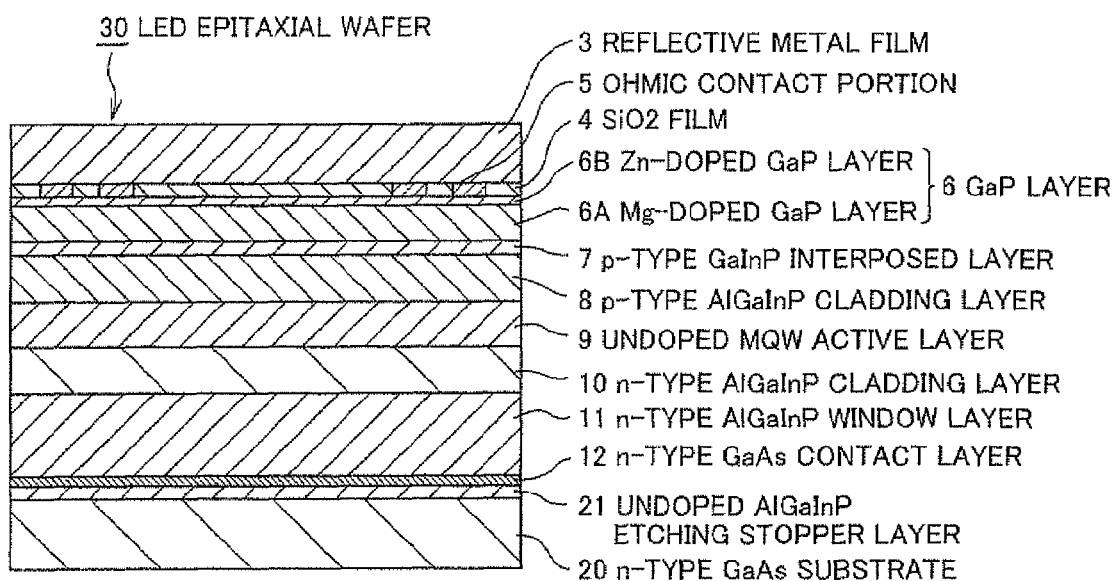

Further, as shown in FIG. 4A, aluminum (Al), titanium (Ti), and gold (Au) are deposited in this order on the $SiO_2$ film 4 and the ohmic contact portion 5 to provide the reflective metal film 3.

Figure 4B:
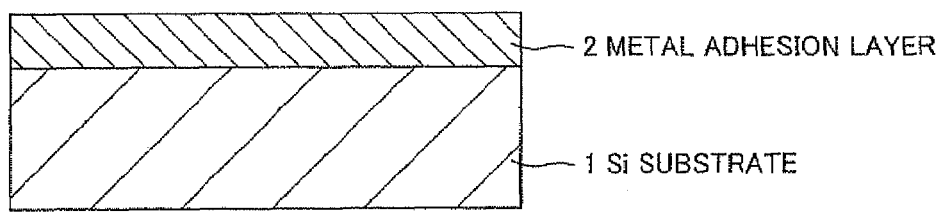

Next, as shown in FIG. 4B, a Si substrate 1 as a conductive substrate is prepared, and AuGe, Ti, and Au are deposited in this order on the surface of the Si substrate 1 to provide the metal adhesion layer 2.

Figure 5:
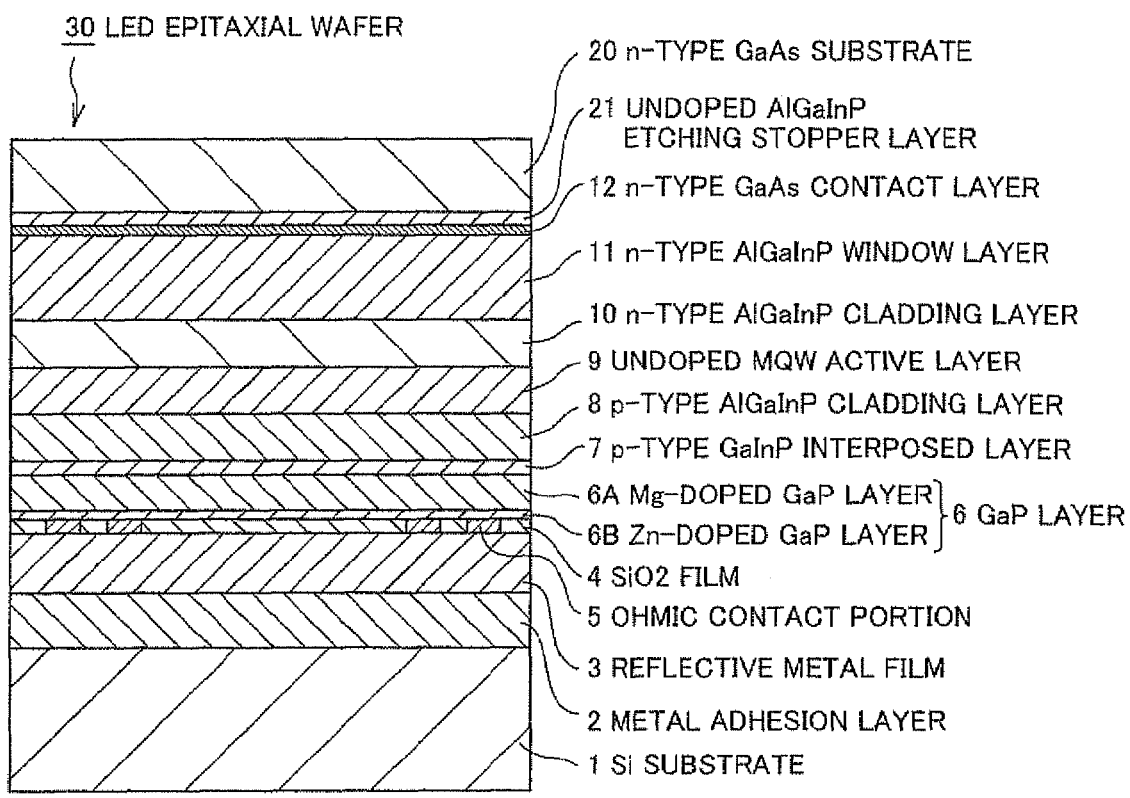

Next, as shown in FIG. 5, the reflective metal film 3 of the LED epitaxial wafer 30 is stuck to the metal adhesion layer 2 of the Si substrate 1, by using the metal adhesion layer 2 as a bonding surface. The sticking process is conducted by holding the LED epitaxial wafer 30 and the Si substrate 1 at a temperature of 350° C. in the state of a load of 30 kgf/cm² in an atmosphere of a pressure of 0.01 Torr for 30 minutes.

Figure 6A:
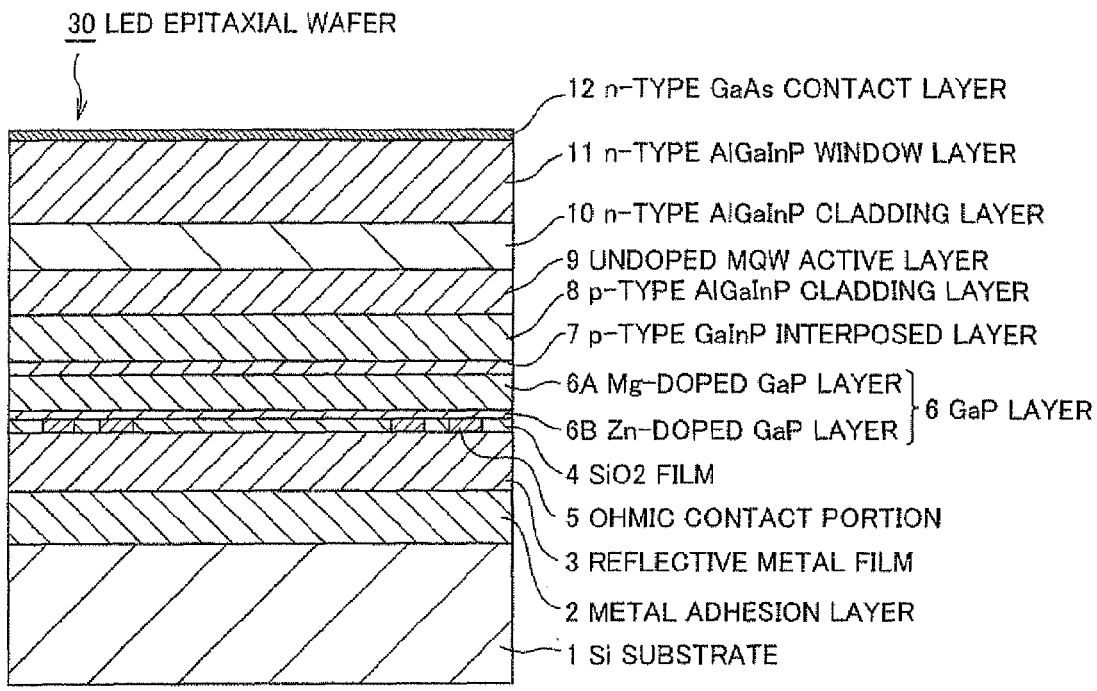

Next, as shown in FIG. 6A, by soaking the LED epitaxial wafer 30 stuck to the Si substrate 1 into ammonia water and hydrogen peroxide water based mixed liquid, the n-type GaAs substrate for growth is removed by the etching to expose the undoped $(Al_{0.7}Ga_{0.3})_{0.5}In_{0.5}P$ etching stopper layer 21. Thereafter, the undoped $(Al_{0.7}Ga_{0.3})_{0.5}In_{0.5}P$ etching stopper layer 21 is removed by using a hydrochloric acid based etching liquid to expose the n-type GaAs contact layer 12.

Figure 6B:
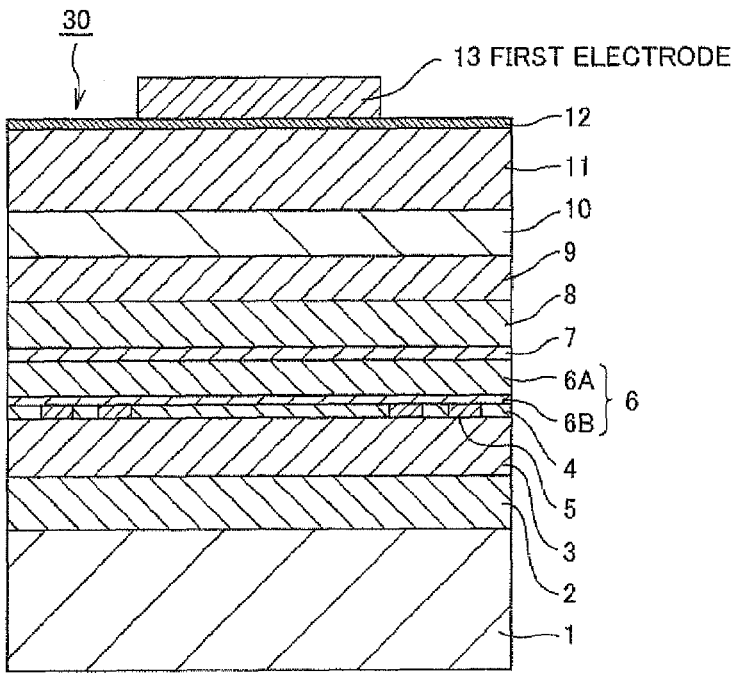

Further, as shown in FIG. 6B, the first electrode 13 is formed on a surface of the n-type GaAs contact layer 12 by using the photolithography such as resist, mask aligner and vacuum deposition method. The first electrode 13 comprises a circular portion with a diameter of 100 μm and branch portions extending radially in a cross shape with a width of 10 μm from the circular portion, as shown in FIG. 1A.

Next, as shown in FIG. 7A, after forming the first electrode 13, the n-type GaAs contact layer 12 except a portion just beneath the first electrode 13 is removed comprising a mixed liquid of sulfuric acid, hydrogen peroxide water and water, to expose the n-type AlGaInP window layer 11.

Thereafter, as shown in FIG. 7B, the second electrode 14 is formed by the vacuum deposition on an entire surface of the Si substrate 1. In more concrete, aluminum (Al), titanium (Ti), and gold (Au) are deposited in this order. Thereafter, by an alloying process of conducting a heat treatment at a temperature of 400° C. in an atmosphere of nitrogen gas for 5 minutes, the second electrode 14 is alloyed.

Finally, the LED epitaxial wafer 30 shown in FIG. 7B is cut by using a dicing apparatus, such that the circular portion of the first electrode 13 is located at a center of a chip, to provide an LED bare chip with dimensions of 300 μm×300 μm. The LED bare chip is mounted (die-bonding) on a TO-18 stem, and wire bonding is conducted for the LED bare chip, to provide an LED device.

As initial characteristics of the LED device thus fabricated, the light output was 4.7 mW and the forward voltage was 2.2 V at a current flow of 20 mA (at the time of evaluation).

Further, so as to provide another LED device, a surface of the n-type AlGaInP window layer 11 is made as a rough surface by hydrochloric acid based etching, to form a semiconductor light emitting device 100 having a minute irregularity on its surface. The LED bare chip thus fabricated is mounted (die-bonding) on a TO-18 stem, and wire bonding is conducted for the LED bare chip, to provide another LED device.

As the initial characteristics of another LED device, the light output was 5.6 mW and the forward voltage was 2.35 V at a current flow of 20 mA (at the time of evaluation).

In addition, so as to further improve the LED characteristics of the semiconductor light emitting device 100 shown in FIG. 1A and FIG. 1B, the Inventors prepared an LED epitaxial wafer in which the configuration is partially changed from the present invention, and the LED epitaxial wafer stuck to a Si substrate was cut to provide the semiconductor light emitting device 100, as a comparative example. Then, an LED device was manufacture by using the semiconductor light emitting device 100 in the comparative example.

COMPARATIVE EXAMPLE

In the comparative example, the conductive material composing the ohmic contact portion 5 of the LED epitaxial wafer 30 is changed. In concrete, an AuBe ohmic contact portion using an AuBe alloy in place of AuZn alloy is formed.

The LED epitaxial wafer thus manufactured is stuck to the Si substrate, and the LED epitaxial wafer is cut similarly to the aforementioned manner, to provide a semiconductor light emitting device. The semiconductor light emitting device is mounted on a TO-18 stem to provide an LED device.

The initial characteristics of the LED device in the comparative example were evaluated. As the initial characteristics, the forward voltage was 1.92 V at a current flow of 20 mA (at the time of evaluation), that is lower than 2.0 V. However, the light output was 3.9 mW, and the light output could not be maintained.

As a reliability test, an electrification test was conducted under the condition of a current flow of 50 mA for 168 hours (1 week) at a room temperature of 25° C. The light output is lowered to about 80% of the initial value after the reliability test. In other words, a relative output (relative output=the light output after electrification/initial light output×100) is about 80%. In the reliability test under the same condition for the LED in which the ohmic contact portion 5 is formed by using AuZn alloy, the relative output was about 92%.

EXAMPLE 1

Figure 8:
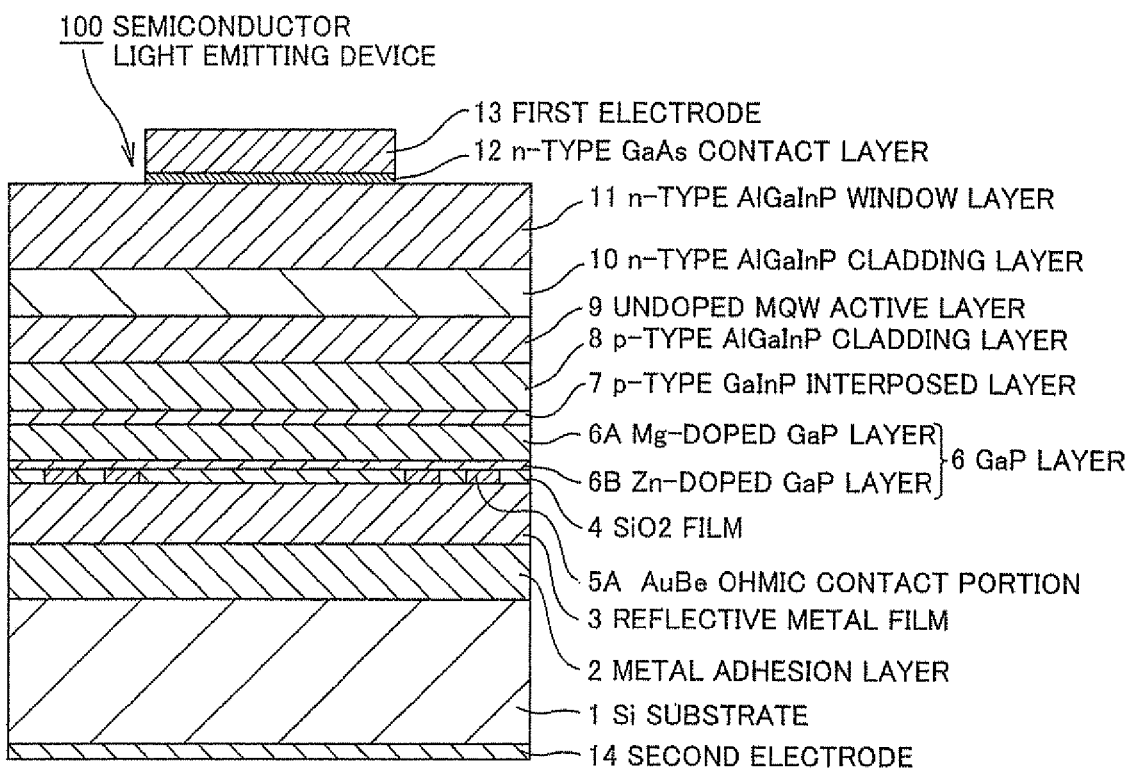
FIG. 8 is a schematic cross sectional view of a LED epitaxial wafer in Example 1 according to the present invention.

FIG. 8 is a schematic cross sectional view of a LED epitaxial wafer in Example 1 according to the present invention.

The LED epitaxial wafer 30 shown in FIG. 8 is cut by using a dicing apparatus, to provide an LED bare chip with dimensions of 300 μm×300 μm. The LED bare chip is used for a red semiconductor light emitting device with an emitting light wavelength of about 630 nm. The LED epitaxial wafer 30 shown in FIG. 8 is partially different in structure from the LED epitaxial wafer in the comparative example.

In the Example 1, the conductive material composing the ohmic contact portion 5A of the LED epitaxial wafer 30 is changed. In concrete, an AuBe ohmic contact portion 5A using an AuBe alloy in place of AuZn alloy is formed. In addition, a thickness of the GaP layer 6A is increased to be 250 nm, and a thickness of the GaP layer 6B is the same, namely 50 nm.

In other words, the Example 1 is different from the comparative example, in that a total thickness of the GaP layer 6A and the GaP layer 6B is increased, and a distance between a light emitting part (p-type cladding layer, active layer, n-type cladding layer) and the AuBe ohmic contact portion 5A is increased.

The LED epitaxial wafer 30 thus manufactured is stuck to the Si substrate, and the LED epitaxial wafer 30 is cut similarly to the aforementioned manner, to provide a semiconductor light emitting device. The semiconductor light emitting device is mounted on a TO-18 stem to provide an LED device.

The initial characteristics of the LED device in the Example 1 were evaluated. As the initial characteristics, the forward voltage was 1.93 V at a current flow of 20 mA (at the time of evaluation), that is much lower than 2.0 V. Further, the light output was 5.3 mW, so that the light output was increased. As to the reliability, the relative output of 91% was achieved.

Namely, it is possible to obtain a low forward voltage, a high luminance and an excellent reliability.

EXAMPLE 2

Figure 9:
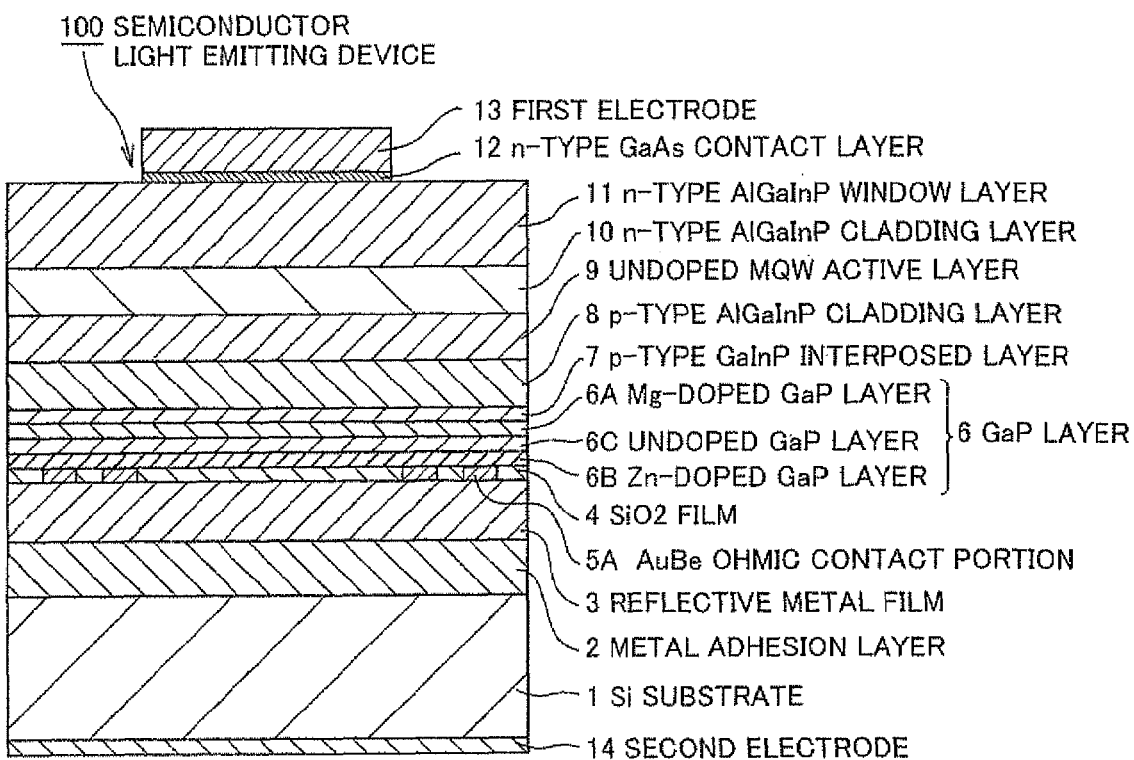
FIG. 9 is a schematic cross sectional view of a LED epitaxial wafer in Example 2 according to the present invention.

FIG. 9 is a schematic cross sectional view of a LED epitaxial wafer in Example 2 according to the present invention.

The LED epitaxial wafer 30 shown in FIG. 9 is cut by using a dicing apparatus, to provide an LED bare chip with dimensions of 300 μm×300 μm. The LED bare chip is used for a red semiconductor light emitting device with an emitting light wavelength of about 630 nm. The LED epitaxial wafer 30 shown in FIG. 9 is partially different in structure from the LED epitaxial wafer in the Example 1.

In the Example 2, the AuBe ohmic contact portion 5A using an AuBe alloy is provided. In addition, a thickness of the GaP layer 6A is reduced to be 100 nm, and an undoped GaP layer 6C is provided as a third layer which is not positively doped between the GaP layer 6A and the GaP layer 6B. A total thickness of the GaP layer 6A, the GaP layer 6B, and the undoped GaP layer 6C is 300 nm.

The LED epitaxial wafer 30 thus manufactured is stuck to the Si substrate, and the LED epitaxial wafer 30 is cut similarly to the aforementioned manner, to provide a semiconductor light emitting device. The semiconductor light emitting device is mounted on a TO-18 stem to provide an LED device.

The initial characteristics of the LED device in the Example 2 were evaluated. As the initial characteristics, the forward voltage was 1.94 V at a current flow of 20 mA (at the time of evaluation), that is lower than 2.0 V. Further, the light output was 5.64 mW, so that the light output was remarkably increased. As to the reliability, the relative output is 96.8%, which is further improved. It is supposed that the improvement in the light output is given by an effect for suppressing the heat generation as a result of reduction in the forward voltage.

Figure 10:
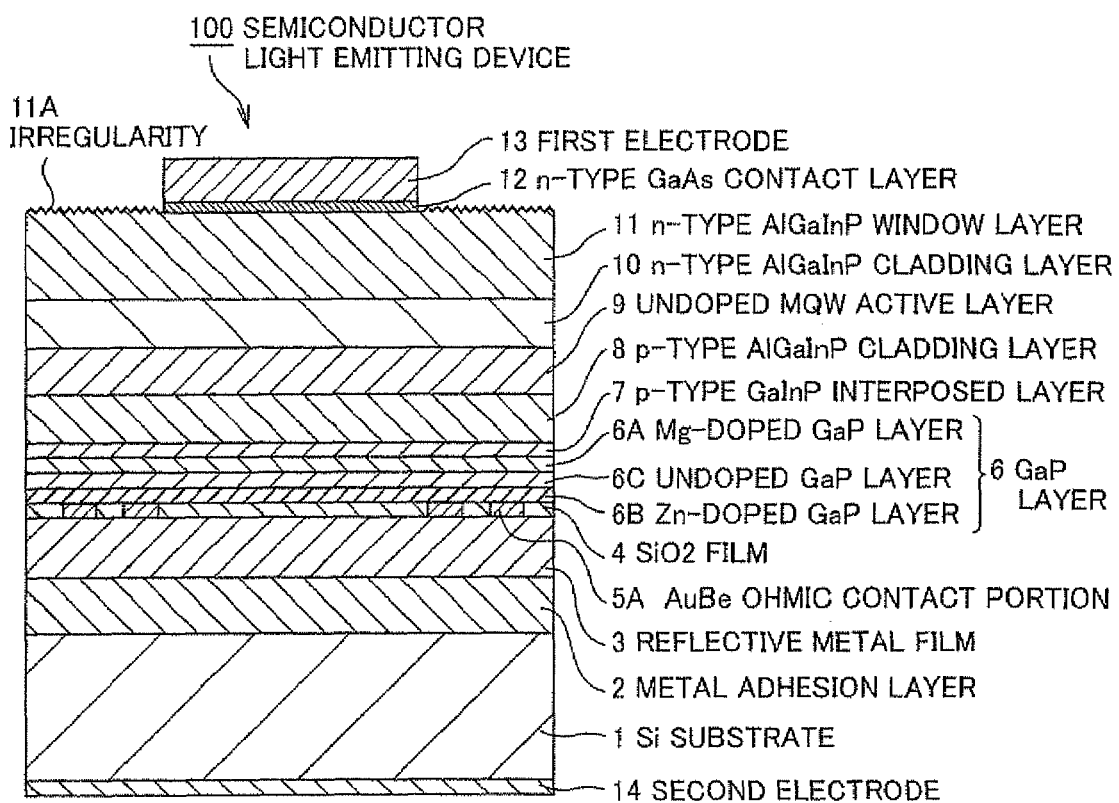
FIG. 10 is a schematic cross sectional view of another LED epitaxial wafer in Example 2 according to the present invention.

FIG. 10 is a schematic cross sectional view of another LED epitaxial wafer in Example 2 according to the present invention.

In the LED epitaxial wafer 30 shown in FIG. 10, an irregularity 11A is formed at the surface of the n-type AlGaInP window layer 11 so as to improve the light extract property.

The LED epitaxial wafer 30 thus manufactured is stuck to the Si substrate, and the LED epitaxial wafer 30 is cut similarly to the aforementioned manner, to device is mounted on a TO-18 stem to provide an LED device.

The initial characteristics of another LED device in the Example 2 were evaluated. As the initial characteristics, the forward voltage was 1.98 V at a current flow of 20 mA (at the time of evaluation), and the light output was 8.27 mW, that is significantly high.

EXAMPLE 3

In Example 3, the ohmic contact portion 5A of the LED epitaxial wafer 30 comprises a AuBe based material. In the Example 3, Ti/AuBe, AuBe/Ti/AuBe, AuBe/Ti, and Ni/AuBe, doped with Ti and Ni that are transition metals, are used as the AuBe based material. Then, four kinds of wafers comprising the AuBe based material ohmic contact portion 5 were prepared.

The LED epitaxial wafer 30 thus manufactured is stuck to the Si substrate, and the LED epitaxial wafer 30 is cut similarly to the aforementioned manner, to provide a semiconductor light emitting device. The semiconductor light emitting device is mounted on a TO-18 stem to provide an LED device.

The initial characteristics and the reliability of the LED device in the Example 3 were evaluated. In all of the four kinds of the LED devices, the characteristics similar to the Example 2 are obtained.

As described above, it is observed that relative output and the reliability are improved and that the forward voltage is increased by doping AuBe with the transition metal. All of the samples in the Example 3 have enough characteristics as the semiconductor light emitting device.

In addition, it is confirmed that characteristics similar to the Example 3 can be obtained, in the semiconductor light emitting device in which the irregularity 11A is formed at the surface of the n-type AlGaInP window layer 11.

(Reasons for Optimum Conditions)

Next, reasons for optimization in the semiconductor light emitting device according to the present invention will be explained as follows.

The GaP layer 6 is divided into the Mg-doped GaP layer 6A and the Zn-doped GaP layer 6B, since a carrier concentration can be increased by Zn-doping compared with Mg-doping. Therefore, it is possible to reduce a contact resistance with the ohmic contact portion 5, thereby reducing the forward voltage.

As to the GaP layer 6, a total thickness of the GaP layer 6A and the GaP layer 6B is not less than 300 nm, so as to prevent a diffusion of the material of the ohmic contact portion 5 into the light emitting layer. The effect for preventing the diffusion can be improved in accordance with an increase in the thickness of the GaP layer 6. However, when the GaP layer 6 is too thick, there is a disadvantage in cost.

In addition, a force applying a stress to the active layer is increased, when the thickness of the GaP layer 6 is increased, since the GaP layer 6 is a lattice mismatch layer. Accordingly, when the thickness of the GaP layer 6 is increased, the reliability is adversely deteriorated. Accordingly, there is a preferable thickness of the GaP layer 6. In concrete, the thickness of the GaP layer is preferably from 300 to 3000 nm, and more preferably from 300 to 2000 nm.

For increasing the thickness of the GaP layer 6, the thickness of the Mg-doped GaP layer 6A is increased and the thickness of the Zn-doped GaP layer 6B is not changed, since Zn diffuses easily compared with Mg. However, when the thickness of the Zn-doped GaP layer 6B is too thin, the effect of Zn-doping is reduced. Therefore, there is an optimum value of the thickness of the Zn-doped GaP layer 6B. The thickness of the Zn-doped GaP layer 6B is preferably from 30 to 100 nm, and more preferably from 50 to 100 nm.

When the Zn-doped GaP layer 6B is adjacent to the Mg-doped GaP layer 6A, a mutual diffusion occurs. Therefore, it is preferable to provide the undoped GaP layer 6C between the Mg-doped GaP layer 6A and the Zn-doped GaP layer 6B. In addition, an effect of preventing diffusion of Zn can be obtained by providing the contact portion 5/Zn-doped GaP layer 6B/undoped GaP layer 6C/Mg-doped GaP layer 6A, and a total thickness of the Mg-doped GaP layer 6A, the undoped GaP layer 6C, and the Zn-doped GaP layer 6B is not less than 300 nm.

In addition, an AlGaAs layer, AlGaInP layer or the like that is transparent with respect to the emission wavelength may be used instead of the GaP layer 6. In this case, the p-type GaInP layer interposing layer 7 may be omitted. Since the AlGaAs layer and the AlGaInP layer are lattice match layers, the deterioration due to the stress can be reduced. However, since an Al composition is increased, a diffusive property of the dopant is increased. Therefore, it is preferable to have a configuration same as that of the GaP layer 6.

Figure 11:
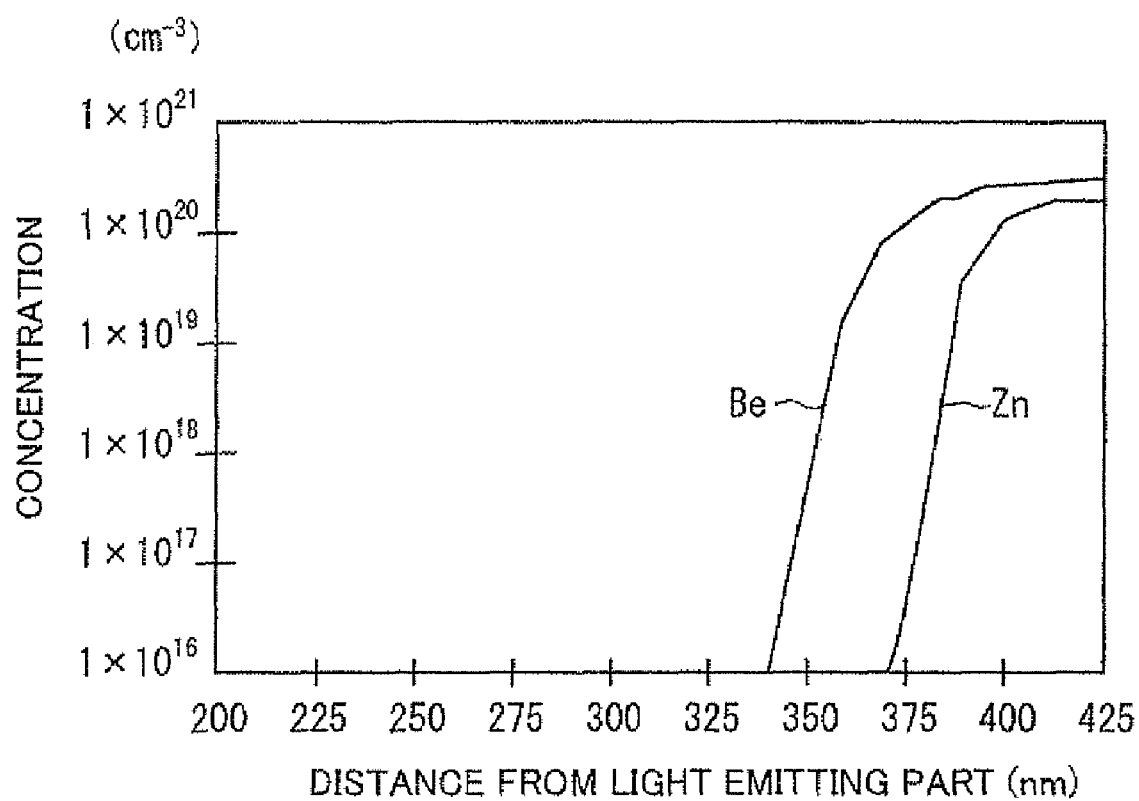
FIG. 11 is a graph showing diffusive properties of conductive materials composing an ohmic contact portion in the LED epitaxial wafer.

FIG. 11 is a graph showing diffusive properties of conductive materials composing an ohmic contact portion in the LED epitaxial wafer.

Herein, the diffusive property of the Zn in AuZn used in the comparative example and the diffusive property of Be in AuBe used in the Examples are analyzed by Secondary Ion Composition Analysis method (SIMS). As a result, it is confirmed that the diffusion of the conductive material does not affect, when a distance between the light emitting part and the ohmic contact portion is not less than 300 nm.

The reliability can be improved to some extent by increasing the thickness of the p-type cladding layer. However, since the p-type cladding layer is the AlGaInP layer, a growth rate cannot be increased and a growth time is required compared with the GaP layer 6, thereby increasing the cost. In addition, since In material is expensive, the use of the AlGaInP layer is a factor for increasing the cost. Therefore, it is inadvisable to increase the thickness of the p-type cladding layer for improving the reliability. It is preferable that the thickness of the p-type cladding layer is not greater than 2000 nm, even if the thickness of the p-type cladding layer is increased.

When the GaAs contact layer 12 is too thin, its original function as a contact layer becomes insufficient. On the contrary, when the GaAs contact layer is too thick, a current is hard to flow, so that a contact resistance is increased, thereby increasing the forward voltage. Therefore, the thickness of GaAs contact layer 12 is preferably from 5 to 200 nm, and more preferably from 10 to 100 nm.

A composition of the p-type GaInP interposed layer 7 is $Ga_xIn_{1-x}P$ ($0.6 \leq x$). If x is less than 0.6, the p-type GaInP interposed layer 7 absorbs the light with an emission wavelength of 630 nm. Therefore, if the emission wavelength is shifted from 630 nm, a value of x will be changed. In other words, when a desired emission peak wavelength is shifted to a short wavelength side, such as 595 nm, it is preferable that the value of x in $Ga_xIn_{1-x}P$ ($0.6 \leq x$) of the p-type GaInP interposed layer 7 is more than 0.6.

It is preferable that the undoped MQW active layer 9 comprises 20 to 160 layers namely 10 to 80 pairs of the MQW structures. The reason therefor is as follows. When the number of pairs is too small, the overflow of electrons or holes occurs, thereby deteriorating internal quantum efficiency. On the other hand, when the number of pairs is too large, the deterioration in the light output due to the light absorption in the undoped MQW active layer 9 occurs. The number of pairs is preferably from 10 pairs to 80 pairs, and more preferably from 20 pairs to 60 pairs. In addition, when the undoped MQW active layer 9 comprises a single layer, the film thickness is preferably from 20 nm to 200 nm for the similar reason.

In the Examples, the so-called undoped layer that is not positively doped or a low concentration layer is not provided between the undoped MQW active layer 9, the n-type AlGaInP cladding layer 10 and the p-type AlGaInP cladding layer 8. However, in order to prevent the diffusion of the dopant into the active layer, an undoped layer or a low concentration layer having a greater bandgap energy and a higher Al composition than those of the undoped MQW active layer 9 may be provided.

The undoped layer or the low concentration layer may have multilayered structure. In this case, it is preferable that the undoped layer having the multilayered structure may comprise $(Al_xGa_{1-x})In_yP_{1-y}$ ($0.3 \leq X \leq 1$, $0.4 \leq Y \leq 0.6$).

In the Examples, the $SiO_2$ layer 4 is provided as an oxide layer. However, the $SiO_2$ layer 4 may not be provided. Further, a SiN film may be provided in place of the oxide layer.

In the Examples, the red LED devices with an emission wavelength of 630 nm are explained. The present invention may be applied to other LED devices using an AlGaInP based material, for example a semiconductor light emitting device with an emission wavelength from 560 nm to 660 nm. Accordingly, the same effect can be obtained in the other semiconductor light emitting devices for a wavelength bandwidth different from that of the semiconductor light emitting devices in the Examples.

The first electrode 13 in the Examples may have other heteromorphous shape. The same effect can be obtained when the shape of first electrode 13 is circular, rectangular, lozenge, polygonal or the like.

In the Examples, the configuration using Si for the supporting substrate is explained. However, a supporting substrate comprising Ge or GaAs may be used, and a metal substrate comprising Cu, Mo, W, CuW or the like may be also used.

In the Examples, the active layer has the MQW structure. The active layer may have an undoped bulk layer (single layer) or a strained MQW structure.

Further, in the Examples, a structure comprising the n-type AlGaInP window layer 11 provided with an irregularity is not explained in detail. However, it is also possible to improve the light extract property by providing a light extract main surface with the irregularity.

Still further, as to the n-type AlGaInP window layer 11, a single layer configuration is explained. However, the n-type AlGaInP window layer 11 may comprise a plurality of layers including different materials such as AlGaInP layers concentrations. It is preferable that AlGaInP based material comprises $(Al_XGa_{1-X})In_YP_{1-Y}$ ($0.3 \leq X \leq 1$, $0.4 \leq Y \leq 0.6$).

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting device, comprising:
   an epitaxial layer including a light emitting part;
   an ohmic contact portion contacting with the epitaxial layer;
   a reflective metal film for reflecting a light emitted from the light emitting part, and contacting with the ohmic contact portion, and being opaque with respect to the light emitted from the light emitting part;
   a supporting substrate, one surface of the supporting substrate bonded to the reflective metal film via a metal adhesion layer;
   a first electrode provided at one surface of the epitaxial layer; and
   a second electrode at another surface of the supporting substrate;
   wherein the ohmic contact portion comprises Be and is distant from the light emitting part by not less than 300 nm.

2. The semiconductor light emitting device according to claim 1, wherein the epitaxial layer comprises a GaP layer as a second conductivity type semiconductor layer, and the GaP layer is contacting with the ohmic contact portion.

3. The semiconductor light emitting device according to claim 1, wherein the light emitting part comprises an active layer, a first conductivity type semiconductor layer comprising a material selected from a group consisting of Se, Si and Te, and a second conductivity type semiconductor layer comprising a dopant selected from a group consisting of Mg and Zn.

4. The semiconductor light emitting device according to claim 2, wherein the second conductivity type semiconductor layer comprises a first layer doped with Mg and a second layer doped with Zn sequentially deposited.

5. The semiconductor light emitting device according to claim 4, further comprising:
   a third layer provided between the first layer and the second layer,
   wherein the third layer is not positively doped with dopant, and the second layer is contacting with the ohmic contact portion.

6. The semiconductor light emitting device according to claim 5, wherein a thickness of the third layer is from 5 nm to 200 nm.

7. The semiconductor light emitting device according to claim 1, further comprising:
   a layer having a bandgap energy smaller than that of an active layer constituting the light emitting part between the first electrode and the epitaxial layer.

8. The semiconductor light emitting device according to claim 7, wherein a thickness of the layer having the bandgap energy smaller than that of the active layer is from 5 to 200 nm.

9. The semiconductor light emitting device according to claim 3, further comprising:
   an interposed layer comprising $Ga_xIn_{1-x}P$ ($0.6 \leq X$) between the ohmic contact portion and the second conductivity type semiconductor layer constituting the light emitting part.

10. The semiconductor light emitting device according to claim 3, further comprising:
    an undoped layer between the active layer and the first conductivity type semiconductor layer or the second conductivity type semiconductor layer, or between the active layer, the first conductivity type semiconductor layer and the second conductivity type semiconductor layer.

11. The semiconductor light emitting device according to claim 3, wherein the active layer comprises a multiquantum well structure including 10 to 80 pairs of well layers.

12. The semiconductor light emitting device according to claim 1, wherein the epitaxial layer comprises a plurality of layers provided above the light emitting part and being transparent with respect to the light emitted from the light emitting part.

13. The semiconductor light emitting device according to claim 2, wherein the ohmic contact portion is buried in an oxide layer provided between the second conductivity type semiconductor layer and the reflective metal film, and a thickness of the oxide layer is within a range of ±30% of a thickness d determined based on a wavelength of the light emitted from the light emitting part and a refractive index of the oxide layer.

14. The semiconductor light emitting device according to claim 1, wherein the supporting substrate comprises a material selected from a group consisting of Si, GaAs, and Ge.

15. The semiconductor light emitting device according to claim 1, wherein the supporting substrate comprises a metal selected from a group consisting of Cu, Mo, W, and Ge, or an alloy of CuW.

16. The semiconductor light emitting device according to claim 1, wherein the ohmic contact portion further comprises a transition metal.

* * * * *